United States Patent [19]
Hamada et al.

[11] Patent Number: 5,685,039
[45] Date of Patent: Nov. 11, 1997

[54] CLEANING APPARATUS

[75] Inventors: Tomoko Hamada, Kumamoto-ken; Mitiaki Matsushita, Yatsushiro; Kiyohisa Tateyama; Akira Yonemizu, both of Kumamoto, all of Japan

[73] Assignee: Tokyo Electron Limited, Tokyo, Japan

[21] Appl. No.: 644,811

[22] Filed: May 10, 1996

[30] Foreign Application Priority Data

May 12, 1995 [JP] Japan .................................. 7-138741

[51] Int. Cl.⁶ .................................................. A46B 13/04
[52] U.S. Cl. .................. 15/88.2; 15/21.1; 15/77; 15/102
[58] Field of Search .............................. 15/21.1, 77, 88.1, 15/88.2, 88.3, 102

[56] References Cited

FOREIGN PATENT DOCUMENTS 3-52228  3/1991  Japan .

Primary Examiner—David Scherbel
Assistant Examiner—Randall Chin
Attorney, Agent, or Firm—Oblon, Spivak, McClelland, Maier & Neustadt, P.C.

[57] ABSTRACT

A cleaning apparatus includes a spin chuck for holding and rotating a wafer, a brush for rubbing the surface of the wafer, and an arm for supporting the brush. A support is coupled to the arm through a linear guide. The arm and the support moves together in a horizontal direction and can relatively displace in a vertical direction. A compression spring is arranged between the arm and the support and deformed in accordance with a relative displacement of the arm and the support in the vertical direction. When the brush contacts the wafer held by the spin chuck, a biasing force of the brush against the wafer is generated in correspondence with deformation of the compression spring. The biasing force of the brush is set by adjusting the downward moving amount of the support in the vertical direction.

20 Claims, 11 Drawing Sheets

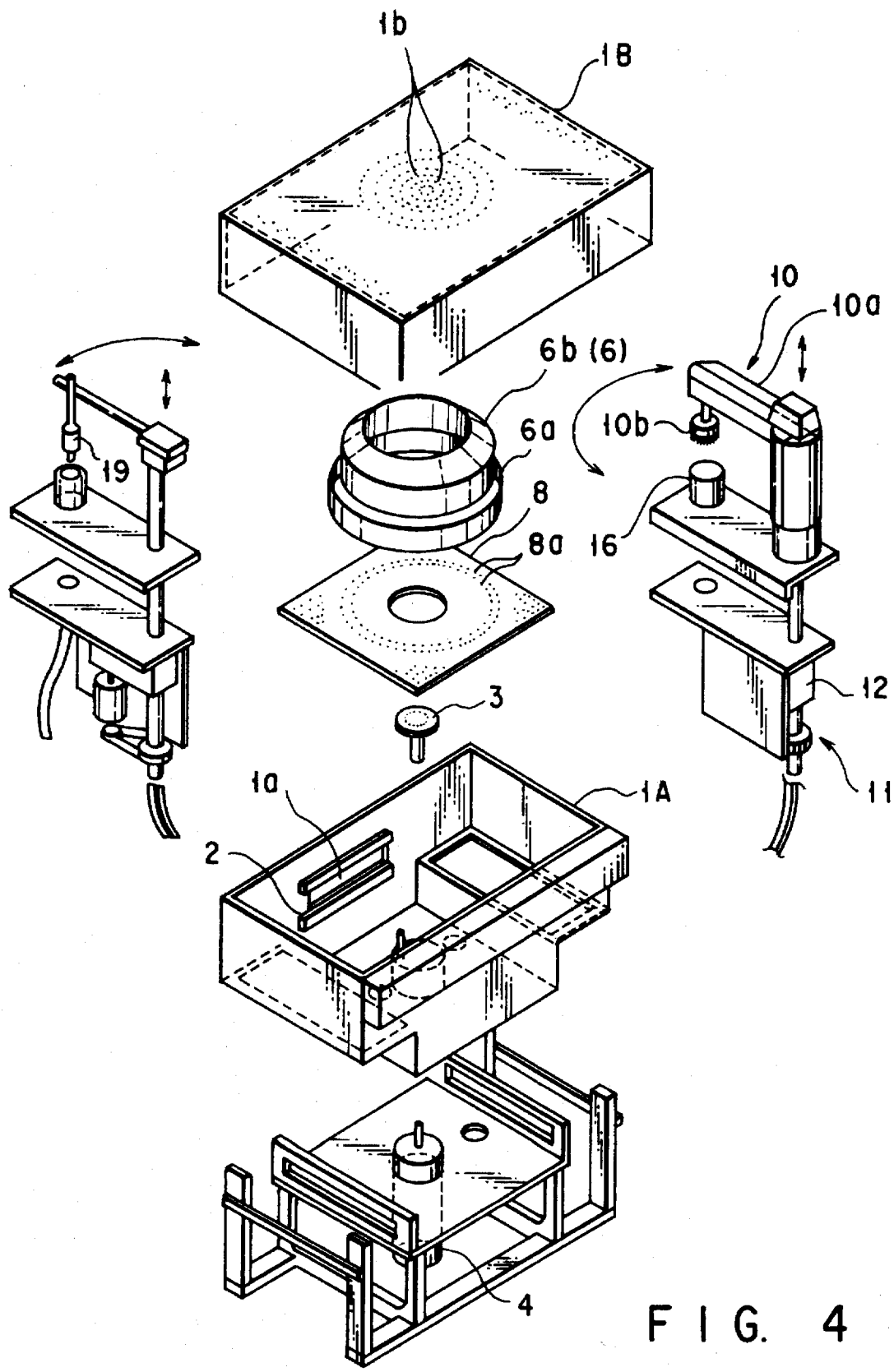
F I G. 4

CLEANING APPARATUS

BACKGROUND OF THE INVENTION

1. Field of the Invention

The present invention relates to a cleaning apparatus for cleaning an object to be treated such as a semiconductor wafer or LCD substrate while brushing it.

2. Description of the Related Art

As a conventional cleaning apparatus of this type, a cleaning apparatus is known, which rotates an object to be treated, e.g., a semiconductor wafer while holding it in a horizontal state and supplies a cleaning liquid to the surface of the semiconductor wafer, and at the same time, presses a brush formed of, e.g., nylon or mohair against the surface of the semiconductor wafer, thereby removing particulate contaminants on the surface.

FIG. 18 shows a conventional cleaning apparatus. This cleaning apparatus has a rotary holder, e.g., a spin chuck 141 disposed in a processing chamber 140 and capable of rotating in the horizontal direction and moving in the vertical direction, and a driving motor 142 for rotating the spin chuck 141. This cleaning apparatus also has a cleaning member, e.g., a brush 143 which contacts the upper surface of a wafer W (the front face on which a semiconductor device is to be formed, or the rear face on the opposite side) held by the spin chuck 141, and a cup 144 movable in the vertical direction to enclose the spin chuck 141 and the wafer W.

In the cleaning apparatus with this arrangement, when the wafer W is to be transferred to the spin chuck 141, the spin chuck 141 and the spin chuck driving motor 142 are moved upward, and at the same time, the cup 144 is moved downward. In the cleaning process, the spin chuck 141 and the driving motor 142 are moved downward, and at the same time, the cup 144 is moved upward, thereby preventing the cleaning liquid from scattering.

Additionally, in the cleaning apparatus with the above arrangement, a pressure adjustment mechanism 145 is arranged to bring the brush 143 into contact with the upper surface (the front face or the rear face) of the wafer W in a pressurized state. As shown in FIG. 18, the pressure adjustment mechanism 145 has an elevating unit 148 coupled to an elevating cylinder 147 for moving the brush 143 and a brush arm 146 in the vertical direction. The elevating unit 148 is coupled to one side of a vertical wall 149 through a linear guide 150 so that the elevating unit 148 can move in the vertical direction.

A counterbalance 152 is arranged on the opposite side of the vertical wall 149 through a linear guide 151 so that the counterbalance 152 can move in the vertical direction. The counterbalance 152 and the elevating unit 148 are coupled to each other through a wire 154 wound on a pulley 153 disposed at the top of the vertical wall 149. Zero balance is adjusted such that the weight of the brush 143 and the brush arm 146 balances that of the counterbalance 152. A pressure cylinder 155 is coupled to the elevating unit 148. With the operation of the pressure cylinder 155, the brush 143 is brought into contact with the upper surface of the wafer W in a pressurized state. The pressure is controlled by the air pressure applied to the pressure cylinder 155.

In the conventional cleaning apparatus of this type, the brush 143 can selectively move between the cleaning position and the non-cleaning position. While the brush 143 is waiting at the non-cleaning position, dust and the like adhering to the brush 143 are removed for preparation for cleaning of the next wafer W. For this reason, the conventional cleaning apparatus has a cleaning vessel 156 as shown in FIG. 19. An ultrasonic oscillator 157 is arranged at the bottom portion of the cleaning vessel 156 which contains the brush 143. A cleaning liquid supply nozzle 158 is disposed at the upper-end opening portion of the cleaning vessel 156.

In the waiting state, a cleaning liquid, e.g., pure water is supplied from the cleaning liquid supply nozzle 158 into the cleaning vessel 156 which contains the brush 143, and the cleaning liquid is overflowed from the cleaning vessel 156. In addition, to remove dust and the like adhering to the brush 143, a fine vibration is applied to the cleaning liquid in the cleaning vessel 156 by the ultrasonic oscillator 157.

Some cleaning apparatuses of this type have a cleaning nozzle for spraying jet water, in addition to the brush 143. This jet water spray nozzle can also selectively move between the cleaning position and the non-cleaning position, like the brush 143. While the cleaning nozzle is waiting at the non-cleaning position, a dummy dispensing operation is performed to prevent the orifice from clogging. For this reason, as shown in FIG. 20A, a mesh 161 for preventing a mist from scattering due to jet spray from a jet water spray nozzle 163 is arranged on the opening side of a container 160 with a drain port 159. As shown in FIG. 20B, an exhaust vent 162 is formed in the side portion of the container 160 to prevent the mist from scattering from the container 160 during the dummy dispensing operation.

In the conventional cleaning apparatus of this type, however, since the spin chuck 141 rotates in the horizontal direction and moves in the vertical direction, an elevating mechanism 141A (elevating cylinder) for the spin chuck 141 must be arranged in addition to an elevating mechanism 144A for the cup 144. In addition, the driving motor 142 for the spin chuck 141 must be simultaneously moved in the vertical direction, resulting in a complex arrangement and a bulky apparatus.

In the cleaning process, the cup 144 is moved upward to enclose the spin chuck 141 and the wafer W, thereby preventing the cleaning liquid from scattering. When the spin chuck 141 rotates, a vortex may be generated on the upper surface (the front face or the rear face) of the wafer W, and the mist of the cleaning liquid may scatter from the cup due to this vortex. This results in a degradation in cleaning efficiency and a decrease in yield.

As described above, in the conventional cleaning apparatus of this type, the pressure adjustment mechanism 145 for the brush 143 is constituted by the counterbalance 152, the pulley 153, the wire 154, the pressure cylinder 155, and the like. Such a complex arrangement results in a difficulty in pressure adjustment and a bulky apparatus. In addition, the wire 154 may be removed from the pulley 153.

The brush 143 in the waiting state is cleaned by ultrasonic vibration while the cleaning liquid in which the brush 143 contained in the cleaning vessel 156 is dipped is overflowed. With this arrangement, the dust and the like removed from the brush 143 may adhere to the brush 143 again due to the overflow.

SUMMARY OF THE INVENTION

It is an object of the present invention to provide a cleaning apparatus with a simple and compact arrangement, which can achieve an increase in throughput and yield.

According to a first aspect of the present invention, there is provided a cleaning apparatus for brushing an object to be treated while rotating the object, comprising:

a spin chuck for holding and rotating the object;

a brush for contacting the object held by the spin chuck to rub a surface of the object;

an arm for supporting the brush;

a processing chamber housing the spin chuck, the brush, and the arm;

a support coupled to the arm and moving together with the arm in a horizontal direction, the support and the arm being capable of relatively displacing in a vertical direction;

a resilient member arranged between the arm and the support and deformed in accordance with a relative displacement of the arm and the support in the vertical direction, the resilient member being deformed and generating a biasing force of the brush against the object when the brush contacts the object held by the spin chuck;

a horizontal driver for moving the support in the horizontal direction; and a vertical driver for moving the support in the vertical direction, wherein the biasing force of the brush is set by adjusting a downward moving amount of the support in the vertical direction.

According to a second aspect of the present invention, there is provided a cleaning apparatus for brushing a front face of a semiconductor wafer on which a semiconductor device is to be formed, while rotating the semiconductor wafer, comprising:

a spin chuck for holding and rotating the wafer;

a brush for contacting the wafer held by the spin chuck to rub a surface of the wafer, the brush comprising a plurality of sponge pillars arranged at intervals and contacting the wafer substantially only with the sponge pillars;

an arm for supporting the brush;

a processing chamber housing the spin chuck, the brush, and the arm;

a support coupled to the arm and moving together with the arm in a horizontal direction, the support and the arm being capable of relatively displacing in a vertical direction;

a resilient member arranged between the arm and the support and deformed in accordance with a relative displacement of the arm and the support in the vertical direction, the resilient member being deformed and generating a biasing force of the brush against the wafer when the brush contacts the wafer held by the spin chuck;

a horizontal driver for moving the support in the horizontal direction; and a vertical driver for moving the support in the vertical direction, wherein the biasing force of the brush is set by adjusting a downward moving amount of the support in the vertical direction.

According to a third aspect of the present invention, there is provided a cleaning apparatus for brushing a rear face of a semiconductor wafer on which no semiconductor device is to be formed, while rotating the semiconductor wafer, comprising: P1 a spin chuck for holding and rotating the wafer;

a brush for contacting the wafer held by the spin chuck to rub a surface of the wafer, the brush comprising a plurality of sponge pillars arranged at an interval and a plurality of bundles of hairs arranged at an interval and contacting the wafer substantially with only the sponge pillars and the bundles of hairs;

an arm for supporting the brush;

a processing chamber housing the spin chuck, the brush, and the arm;

a support coupled to the arm and moving together with the arm in a horizontal direction, the support and the arm being capable of relatively displacing in a vertical direction;

a resilient member arranged between the arm and the support and deformed in accordance with a relative displacement of the arm and the support in the vertical direction, the resilient member being deformed and generating a biasing force of the brush against the wafer when the brush contacts the wafer held by the spin chuck;

a horizontal driver for moving the support in the horizontal direction; and a vertical driver for moving the support in the vertical direction, wherein the biasing force of the brush is set by adjusting a downward moving amount of the support in the vertical direction.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is an exploded perspective view of the main part of the cleaning apparatus shown in FIG. 1;

DETAILED DESCRIPTION OF THE PREFERRED EMBODIMENTS

Figure 1:
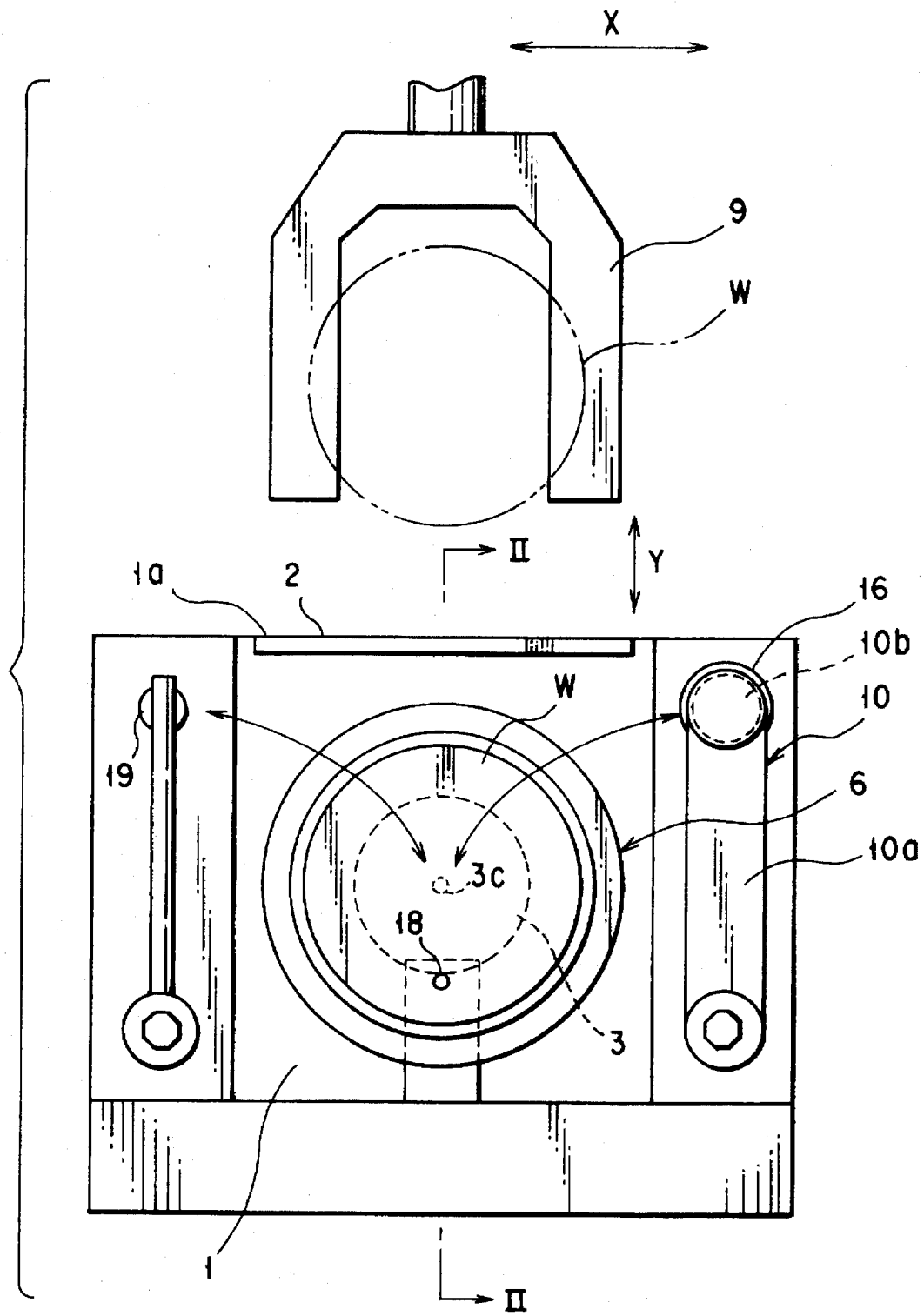
FIG. 1 is a plan view schematically showing a cleaning apparatus according to an embodiment of the present invention.

A semiconductor wafer cleaning apparatus according to an embodiment of the present invention shown in FIG. 1 has a processing chamber 1. The processing chamber 1 has, at its side wall portion, an opening portion 1a through which a wafer W, as an object to be treated, passes. The opening portion 1a of the processing chamber 1 can be closed by a shutter member 2 (opening/closing means).

A rotary holder, e.g., a spin chuck 3 for holding the wafer W is arranged in the processing chamber 1. A cylindrical container, e.g., a cup 6 is disposed to enclose the spin chuck 3 and the wafer W held on the spin chuck 3. A cleaning brush mechanism 10 serving as a cleaning means is arranged, which contacts the surface of the wafer W (the front face on which a semiconductor device is to be formed, or the rear face on the opposite side) to remove particulate contaminants on the surface of the wafer W together with a supplied cleaning liquid. In addition to the cleaning brush mechanism 10, a nozzle 19 for spraying jet water is arranged.

A transfer means, e.g., a transfer arm 9 accessible to the opening portion 1a is disposed outside the processing chamber 1. The transfer arm 9 is movable in the horizontal direction, i.e., in the X and Y directions, in the direction of rotation (θ), and in the vertical (Z) direction, and holds the wafer W. The wafer W is transferred between the transfer arm 9 and the spin chuck 3.

The spin chuck 3 has, on its upper surface, a suction port of a vacuum suction hole 3c formed in a driving shaft 3a. The vacuum suction hole 3c communicates with a vacuum unit (not shown) through a passage 3b and a seal portion 5. The spin chuck 3 holds the wafer W on its upper surface by using vacuum suction. The driving shaft 3a of the spin chuck 3 extends outward from the bottom portion of the processing chamber 1 and is connected to a motor 4 fixed outside the processing chamber 1. The spin chuck 3 is rotated by driving the motor 4.

The cup 6 has a cylindrical outer cup part 6a arranged to stand on a base plate 8 fixed at the bottom portion of the processing chamber 1, and an inner cup part 6b arranged inside the outer cup part 6a to be movable in the vertical direction. The inner cup part 6b has, on its upper-end opening side of a cylindrical base portion 6c, a tapered surface 6d which is tapered inward. An inward flange portion 6e is formed at the distal end of the inner cup part 6b.

An elevating rod 6g is coupled to the inner cup part 6b through a bracket 6f extending from the lower end of the cylindrical base portion 6c. The elevating rod 6g is coupled, through a coupling member 6h, to a vertical piston rod 7a of an elevating cylinder 7 arranged outside the lower end of the processing chamber 1. Therefore, the inner cup part 6b is moved in the vertical direction by driving the elevating cylinder 7. Upon moving upward, the inner cup part 6b encloses the spin chuck 3 and the wafer W. Upon moving downward, the upper end of the inner cup part 6b comes below the spin chuck 3. A gap formed between the base plate 8 and the lower end of the inner cup part 6b when the inner cup part 6b moves upward is closed by the outer cup part 6a. For this reason, the cleaning liquid used for cleaning can be prevented from flowing from the cup 6.

The shutter member 2 is attached to the coupling member 6h, so that the shutter member 2 is opened/closed by driving the elevating cylinder 7. Therefore, the elevating operation of the inner cup part 6b and the opening/closing operation of the shutter member 2 can be simultaneously performed by driving the elevating cylinder 7.

Air supply holes 1b consisting of a large number of small holes are coaxially formed at the center of the ceiling portion of the processing chamber 1. On the other hand, a large number of vent holes 8a are coaxially formed in the base plate 8 near the inner wall of the inner cup part 6b. The vent holes 8a communicate with a discharge/exhaust means (not shown) through a drain/exhaust vent 1c formed at the bottom portion of the processing chamber 1. With this arrangement, the air supplied from the air supply holes 1b into the processing chamber 1 flows along the tapered surface 6d of the inner cup part 6b and the inner wall of the inner cup part 6b and is exhausted from the exhaust vent 1c through the vent holes 8a.

Therefore, the mist of the cleaning liquid, which is generated during the cleaning process, can be discharged by this air flow. In addition, the mist of the cleaning liquid can be prevented from scattering from the cup 6 due to the vortex generated upon rotation of the spin chuck 3. As shown in FIG. 4, the processing chamber 1 is integrally formed of a processing chamber main body 1A consisting of a corrosion- and chemical-resistant synthetic resin such as vinyl chloride or polypropylene, and a cover member 1B consisting of a similar synthetic resin to close the upper portion of the processing chamber main body 1A.

Figure 3:
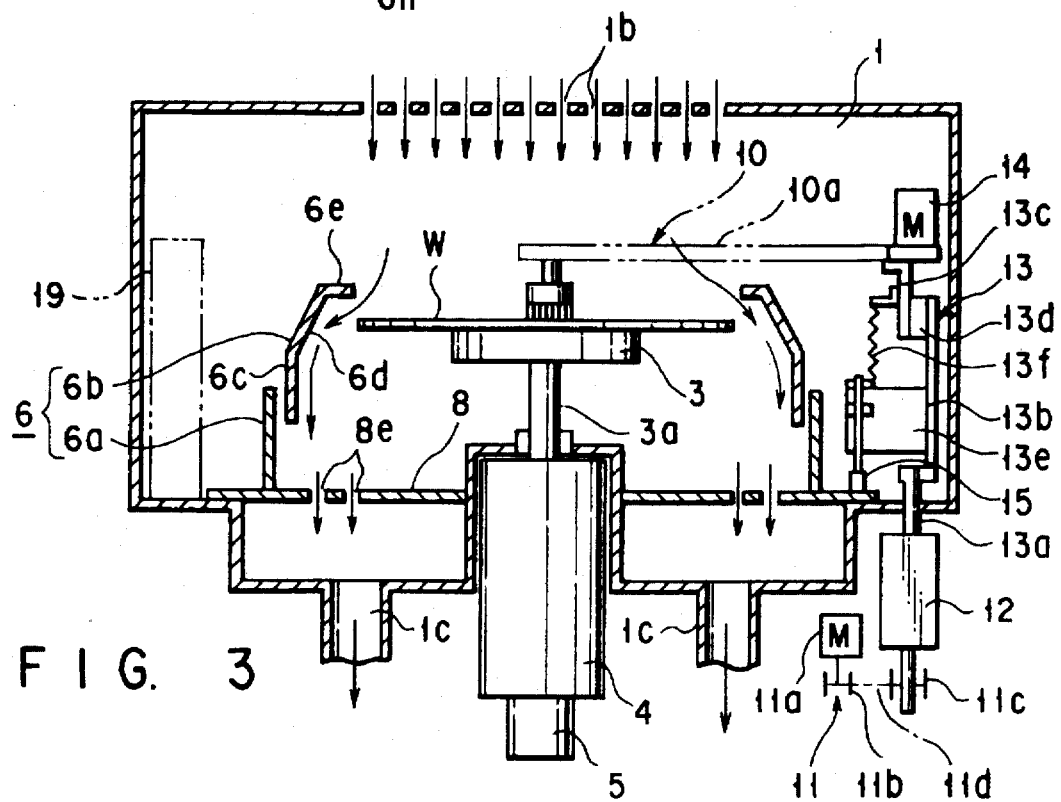
FIG. 3 is a sectional front view of the cleaning apparatus shown in FIG. 1.
Figure 5:
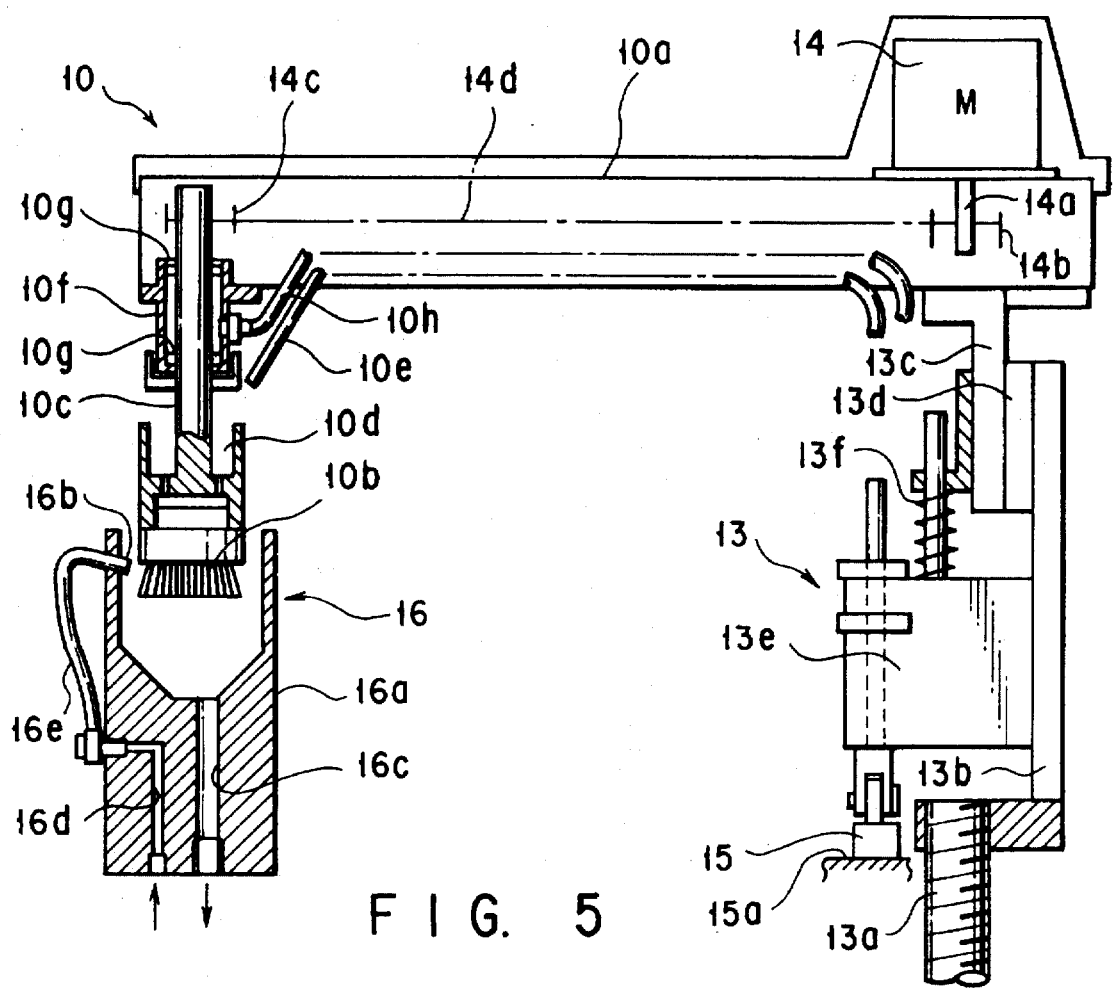
FIG. 5 is a sectional view showing a pressure adjustment mechanism and a nozzle cleaning unit.

As shown in FIGS. 3 to 5, the cleaning brush mechanism 10 has a horizontal moving means, e.g., a brush arm 10a coupled to a rotation driver 11 and a vertical driver 12 through a pressure adjustment mechanism 13. A cleaning member, e.g., a brush 10b is rotatably mounted on the free end portion of the brush arm 10a. A motor 14 is attached to the proximal side of the brush arm 10a. A timing belt 14d is looped between a driving pulley 14b mounted on a driving shaft 14a of the motor 14 and a driven pulley 14c mounted on a mounting shaft 10c on which the brush 10b is mounted. When the motor 14 is driven, the brush 10b is rotated in a horizontal plane (rotated about the vertical shaft as its axis). When the front face of the wafer W is to be cleaned, it is preferable that the brush 10b of the cleaning brush mechanism 10 be prevented from rotation about its axis. The reason for this is that damage to the film quality of the front face of the wafer must be prevented.

A cylindrical cleaning liquid receptacle 10d is attached to the mounting shaft 10c on the brush 10b. A cleaning liquid, e.g., pure water is supplied from a cleaning liquid supply tube 10e to the cleaning liquid receptacle 10d. The cleaning liquid flows through a plurality of through holes formed in the bottom portion of the cleaning liquid receptacle 10d and is supplied to the brush 10b to clean the wafer W.

The mounting shaft 10c is inserted to a sleeve 10f suspending from the free end of the brush arm 10a. A pair of bearings 10g are arranged in the sleeve 10f to rotatably support the mounting shaft 10c. Dust generated from the bearings 10g in the sleeve 10f is sucked by a tube 10h.

As shown in FIGS. 3 and 5, the pressure adjustment mechanism 13 has a shaft 13a which is rotated by the rotation driver 11 and moved in the vertical direction by the vertical driver 12. A support 13b is coupled to the shaft 13a, so that the support 13b is turned and moved in the vertical direction in accordance with rotation and vertical movement of the shaft 13a. A connector 13c suspends from the proximal side of the brush arm 10a and coupled to the support 13b through a linear guide 13d (coupling portion). The connector 13c is turned together with the support 13b and can also be relatively moved with respect to the support 13b in the vertical direction. A spring member consisting of a resilient body, e.g., a helical compression spring 13f is arranged between the connector 13c and a bracket 13e projecting from the support 13b.

The weight of the cleaning brush mechanism 10 whose vertical movement is guided by the linear guide 13d, i.e., the weight of the brush arm 10a, the brush 10b, and the like is applied to the spring member 13f. To adjust the pressure acting on the wafer-W, the downward moving amount, i.e., the downward feeding amount of the support 13b by the vertical driver 12 is adjusted. In other words, to be adjusted is the level of the lowermost point of the brush arm 10a, which is decided on the condition that the brush 10b does not contact the wafer W and the support 13b and the brush arm 10a are integrally moved downward.

For example, assume that, when the brush 10b does not contact the wafer W, the downward moving amount of the support 13b is set such that the lower surface of the brush arm 10a comes below the upper surface of the wafer W by x mm. In this setting condition, when the brush 10b contacts the wafer W, the brush 10b cannot be below the wafer W. For this reason, the spring member 13f extends by x mm, and a biasing force corresponding to this extension amount is applied to the brush 10b. The biasing force, i.e., a pressure F of the brush 10b to the wafer W at this time is defined as F=k·α, where k is a spring constant.

When the brush 10b comes in contact with the wafer W, the pressure F can be adjusted and set within some allowance because the brush 10b itself also acts as a spring. In this manner, when the pressure adjustment mechanism 13 using the spring characteristics of the resilient body 13f is used, the arrangement can be simplified as compared to the conventional pressure adjustment mechanism comprising a counterbalance, a pulley, a wire, a pressure cylinder, and the like. At the same time, pressure adjustment can be easily performed. As the resilient body 13f, a leaf spring member, a rubber member, or the like can be used, in addition to the helical spring member.

A stopper bearing 15 for regulating the maximum downward moving amount of the support 13b, i.e., the lowermost point of the brush arm 10a, is attached to the bracket 13e projecting from the Support 13b. A shaft for supporting the stopper bearing 15 is mounted in the bracket 13e to be adjusted over its position by a screw mechanism within a predetermined range in the vertical direction. The stopper bearing 15 is arranged to roll on an arcuated guide surface 15a having its center at the center of horizontal swing of the brush arm 10a. When the brush arm 10a is swung while the brush 10b is in contact with the wafer W, the stopper bearing 15 rolls on the guide surface 15a in accordance with swing of the support 13b which is moved by the rotation driver 11 in a horizontal plane in the forward/reverse direction.

The rotation driver 11 has a motor 11a. A timing belt 11d is looped between a driving pulley 11b mounted on the driving shaft of the motor 11a and a driven pulley 11c mounted on the shaft 13a. The vertical driver 12 uses a ball screw mechanism.

A brush cleaning unit 16 for cleaning the brush 10b is arranged at the waiting position of the cleaning brush mechanism 10. As shown in FIG. 5, the brush cleaning unit 16 has a cleaning vessel 16a in which the brush 10b is inserted. A nozzle 16b projects near the opening portion of the cleaning vessel 16a to spray a cleaning liquid, e.g., pure water from the upper side to the proximal side of the brush 10b. A discharge passage 16c is formed at the bottom portion of the cleaning vessel 16a. A discharge tube (not shown) is connected to the discharge passage 16c. An L-shaped cleaning liquid supply passage 16d open to the lower and side ends is formed at the lower portion of the cleaning vessel 16a. A cleaning liquid supply tube (not shown) is connected to the lower end of the cleaning liquid supply passage 16d. A tube 16e for supplying the cleaning liquid to the cleaning vessel 16a through the nozzle 16b is connected to the side end of the cleaning liquid supply passage 16d.

When the brush 10b is to be cleaned in the brush cleaning unit 16, the brush 10b is moved to the waiting position and contained in the cleaning vessel 16a. While rotating the brush 10b, the cleaning liquid is sprayed from the nozzle 16b to the proximal side of the cleaning brush mechanism 10, thereby removing dust and the like adhering to the brush 10b. The removed dust and the like are discharged through the discharge passage 16c, so they never adhere to the brush 10b again.

Figure 6:
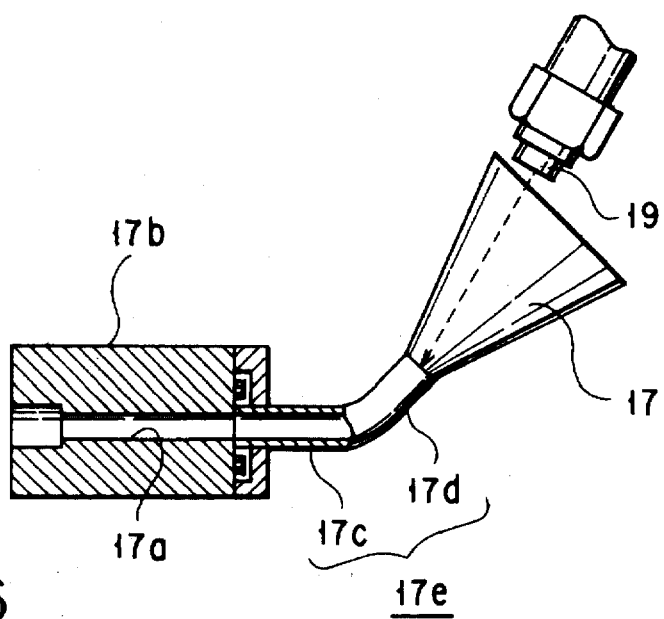
FIG. 6 is a partially sectional view showing the dummy dispensing state of a jet water spray nozzle.

A funnel-like drain cup 17 opposing the orifice of the jet water spray nozzle 19 is arranged at the waiting position of the jet water spray nozzle 19. As shown in FIG. 6, the drain cup 17 is connected to a mounting base portion 17b having a horizontal discharge passage 17a through a discharge tube 17e. The discharge tube 17e has a horizontal portion 17c connected to the mounting base portion 17b and an oblique portion 17d standing upward inclined with respect to the horizontal portion 17c.

When the drain cup 17 is formed into a funnel-like shape, jet water sprayed from the jet water spray nozzle 19 in the dummy dispensing operation can be effectively guided to the horizontal discharge passage 17a side. With this arrangement, the jet water can be received by the drain cup 17 without scattering, and discharged through the discharge tube 17e and the discharge passage 17a. Therefore, unlike the prior art, no mesh for preventing the mist from scattering need be arranged in the drain cup, so that the dummy dispensing operation for preventing clogging in the jet water spray nozzle 19 can be performed with a simple arrangement.

A rinsing liquid supply nozzle 18 is arranged at the upper portion on the opposite side of the opening portion 1a of the processing chamber 1. After cleaning by the cleaning brush mechanism 10 or jet water cleaning is performed, the rinsing liquid supply nozzle 18 supplies a rinsing liquid to the surface of the wafer W to remove a residue or the cleaning liquid from the wafer W.

The operation of the cleaning apparatus with the above arrangement will be described below. In this case, cleaning of the front face of the wafer W will be described.

Upon driving the elevating cylinder 7, the shutter member 2 moves downward to open the opening portion 1a of the processing chamber 1. At the same time, the inner cup part 6b moves downward. The wafer W is transferred into the processing chamber 1 while held by the transfer arm 9, and set above the spin chuck 3. The transfer arm 9 moves downward to mount the wafer W on the spin chuck 3, and the wafer W is held on the spin chuck 3 using vacuum suction.

The transfer arm 9 retreats from the processing chamber 1, and simultaneously, the brush arm 10a is swung by driving the rotation driver 11, so that the cleaning brush mechanism 10 is moved to a portion above the center of the wafer W. Subsequently, the brush arm 10a is moved downward to a predetermined position by driving the vertical driver 12. The brush 10b is pressed against the upper surface, i.e., the front face of the wafer W at a predetermined set pressure. At this time, the shutter member 2 moves upward to close the opening portion 1a. Simultaneously, the inner cup part 6b moves upward to enclose the wafer W and the spin chuck 3.

The wafer W is rotated by rotating the spin chuck 3. In accordance with swing of the brush arm 10a, the brush 10b is relatively moved with respect to the wafer W (e.g., moved from the center of the wafer W to the periphery of the wafer W or along the diameter of the wafer W). At this time, the cleaning liquid is supplied from the supply tube 10e to remove particulate contaminants from the surface of the wafer W. During this operation, the brush 10b may or may not be rotated by the brush rotating motor 14. After brush cleaning, jet water cleaning is performed as needed. Subsequently, a rinsing liquid is supplied from the rinsing liquid supply nozzle 18 to remove the residue or cleaning liquid from the surface of the wafer W. In addition, a spin drying operation is performed by rotating the spin chuck 3.

After the wafer W is cleaned, the brush 10b is returned to the waiting position and cleaned in the brush cleaning unit 16 to prepare for the next cleaning operation. The jet water spray nozzle 19 is returned to a position opposing to the opening portion of the drain cup 17, and the dummy dispensing operation is performed. After the cleaning process, the shutter member 2 moves downward to open the opening portion 1a, and at the same time, the inner cup part 6b moves downward to release the wafer W. The transfer arm 9 moves to a position below the wafer W and then moves upward to receive the wafer W. Thereafter, the transfer arm 9 retreats to transfer the wafer W from the processing chamber 1.

The cleaning apparatus with the above arrangement is used as a stand-alone apparatus, but may be incorporated in the semiconductor wafer coating/development system, as will be described below.

Figure 7:
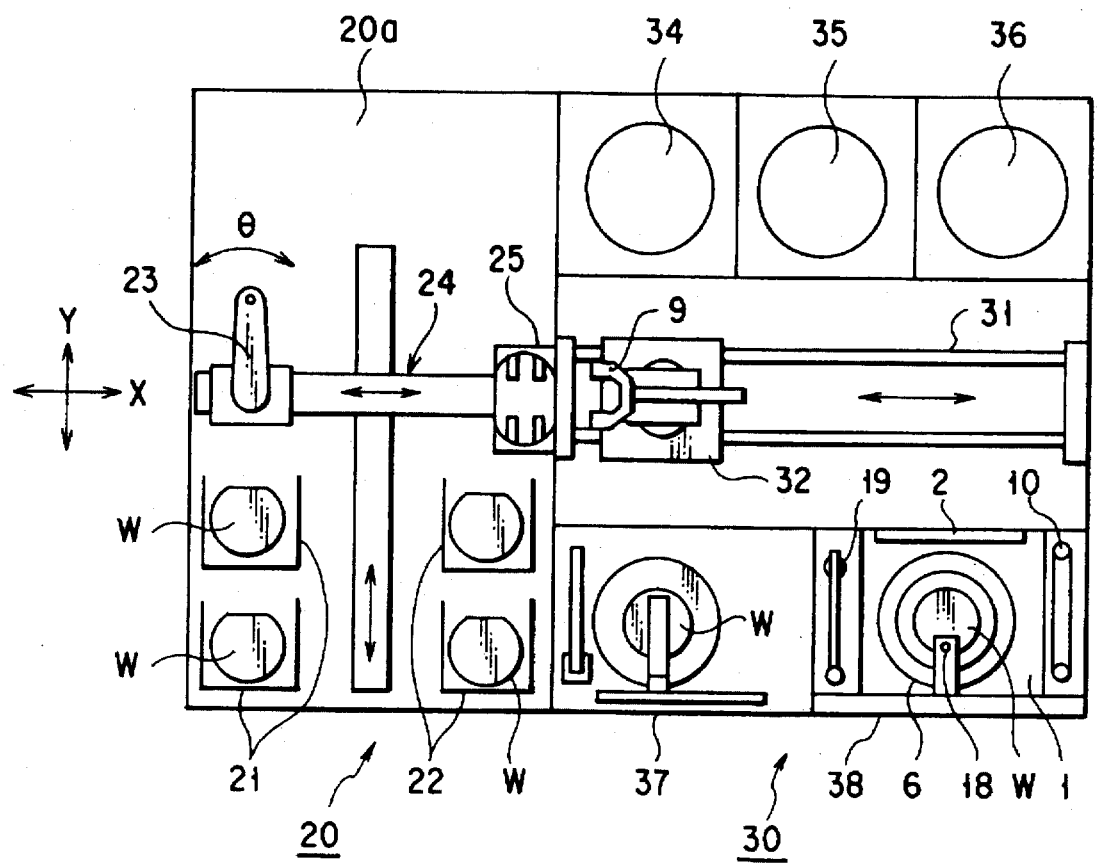
FIG. 7 is a view showing the layout of a semiconductor wafer coating/development system incorporating the cleaning apparatus shown in FIG. 1.

As shown in FIG. 7, the semiconductor wafer coating/development system has a processing unit 30 in which a processing mechanism for performing various processing of the wafer W is arranged, and an in/out unit 20 for automatically transferring the wafer W into/from the processing unit 30.

The in/out unit 20 has a table 20a on which wafer carriers 21 for containing the wafers W before processing and wafer carriers 22 for containing the wafers W after processing are mounted. An arm 23 for holding the wafer W, and a moving mechanism 24 for moving the arm 23 in the X and Y (horizontal), Z (vertical), and θ (rotation) directions are arranged on the table 20a. Adjacent to the processing unit 30, an alignment stage 25 is arranged to align the wafer W and transfer the wafer W to/from the processing unit 30.

In the processing unit 30, a transfer mechanism 32 is arranged to be movable along a transfer path 31 formed from the alignment stage 25 along the X direction. The above-described transfer arm 9 is arranged in the transfer mechanism 32 to be movable in the Y, Z, and θ directions.

An adhesion processing mechanism 34, a prebake mechanism 35, and a cooling mechanism 36 are disposed on one side of the transfer path 31. The adhesion processing mechanism 34 performs adhesion processing to increase the adhesion between the wafer W and a resist film. The prebake mechanism 35 heats and evaporates a solvent remaining in the resist applied to the wafer W. The cooling mechanism 36 cools the heated wafer W.

A processing solution coating mechanism 37 and a cleaning apparatus 38 as described above are arranged on the other side of the transfer path 31. The processing solution coating mechanism 37 applies a resist to the surface of the wafer W. The cleaning apparatus 38 performs cleaning to remove particulate contaminants adhering to the surface of the wafer W.

In the semiconductor wafer coating/development system, first, the wafer W before processing is transferred from the wafer carrier 21 by the arm 23 of the in/out unit 20 and mounted on the alignment stage 25. The wafer W on the alignment stage 25 is held by the transfer arm 9 of the transfer mechanism 32, transferred to the cleaning apparatus 38, and subjected to the cleaning process. Thereafter, the wafer W is transferred to the various processing mechanisms 34 to 38 and subjected to appropriate processing operations. The wafer W after processing is returned to the alignment stage 25 by the transfer arm 9, further transferred by the arm 23, and contained in the wafer carrier 22.

In the above embodiment, the spin chuck 3 uses vacuum suction. However, the holding system need not always use vacuum suction. For example, a Bernoulli chuck mechanism which uses a negative pressure generated by supplying a fluid, e.g., a gas such as an $N_2$ gas or air or a liquid such as pure water, to hold the wafer W may be used. Alternatively, a mechanical wafer holding mechanism using a link mechanism or the like may be used. When the Bernoulli chuck mechanism or mechanical wafer holding mechanism is used, rear face cleaning can be performed, as in cleaning of the front face of the wafer W. In the above embodiment, the cleaning apparatus has the jet water spray nozzle 19 in addition to the cleaning brush mechanism 10. However, a megasonic (ultrasonic) cleaning unit may be arranged in place of the jet water spray nozzle 19.

A difference between cleaning of the front face of a wafer (front face cleaning) and cleaning of the rear face of a wafer (rear face cleaning) will be described below.

In the front face cleaning, it is preferable that the brush 10b be moved in the horizontal direction in accordance with swing of the brush arm 10a without rotating (rotation about its axis) the brush 10b by the brush rotating motor 14. Since front face cleaning requires a very delicate operation, rotation of the brush 10b may adversely affect on the film quality of the wafer. In the front face cleaning, therefore, while relatively moving the cleaning brush mechanism 10 with respect to the wafer (e.g., moving the cleaning brush mechanism 10 from the center to the periphery or along the diameter of the wafer W), the cleaning liquid is supplied from the supply tube 10e, thereby removing particulate contaminants from the surface of the wafer W.

On the other hand, in the rear face cleaning, even when the brush 10b rotates about its axis, the film quality of the wafer is hardly adversely affected. In the rear face cleaning, therefore, while rotating the brush 10b about its axis by the motor 14, and at the same time, relatively moving the brush 10b in accordance with swing of the brush arm 10a, the cleaning liquid is supplied from the supply tube 10e, thereby removing particulate contaminants from the surface of the wafer W.

When a mechanical system (including a Bernoulli chuck mechanism) is employed as the spin chuck 3, the film quality is hardly adversely affected because the edge of the wafer is gripped. However, when the spin chuck 3 uses vacuum suction, the film quality of the wafer on the suction surface side may be adversely affected. Therefore, the front face cleaning and rear face cleaning are preferably performed using one of the following two arrangements.

(1) In the front face cleaning, a vacuum suction chuck is employed. In the rear face cleaning, a mechanical chuck is employed.

(2) In both the front face cleaning and rear face cleaning, a mechanical chuck is employed. In this case, however, the rear face cleaning is performed first, and then, the front face cleaning is performed. When the rear face cleaning is performed first, and then, the front face cleaning is performed, the film quality on the front face side is not adversely affected as compared to a case wherein the front face cleaning is performed first, and the rear face cleaning is then performed.

The cleaning brush mechanism 10 according to another embodiment will be described below.

Figure 8:
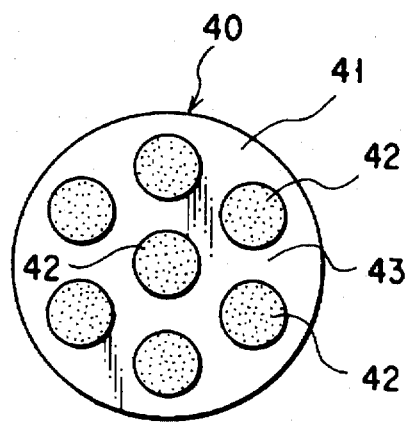
FIG. 8 is a plan view showing the main part of a front face cleaning brush.
Figure 9:
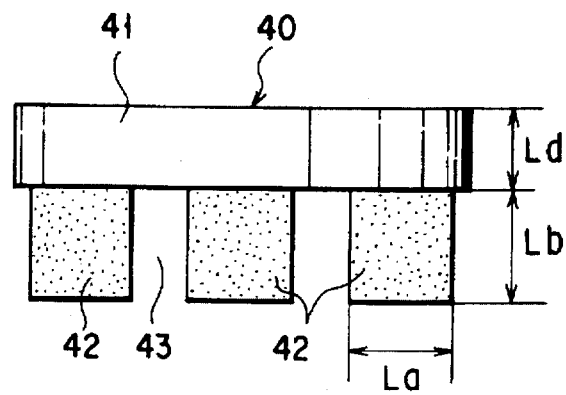
FIG. 9 is an enlarged side view of the cleaning brush shown in FIG. 8.

FIG. 8 is a plan view showing the main part of a front face cleaning brush 40. This front face cleaning brush 40 has a chemical-resistant base 41 consisting of, e.g., a plastic, and a plurality of columnar sponge pillars 42 consisting of, e.g., polyvinyl alcohol or polypropylene and point-symmetrically arranged on the base 41. A total of seven sponge pillars 42 are arranged, i.e., six are arranged point-symmetrically with respect to the central point while one is arranged at the center. Appropriate pitches 43 are formed between the sponge pillars 42. For example, each sponge pillar 42 has a diameter La of 7 mm, a length Lb of 5 mm. The plastic base 41 has a thickness Ld of 3 mm and a diameter of 30 mm.

Figure 10:
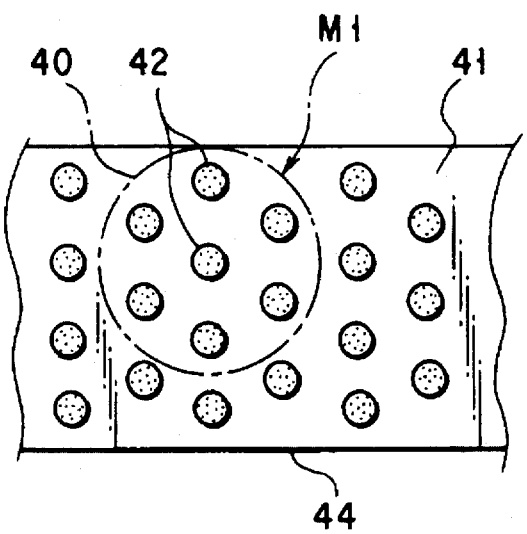
FIG. 10 is a view showing a method of forming the cleaning brush shown in FIG. 8.

As shown in FIG. 10, the front face cleaning brush 40 can be formed of a commercially available product, i.e., a so-called stagger sheet 44 with a large number of sponge pillars 42 arranged in a staggered manner on the plastic base 41. The cleaning brush 40 can be obtained by cutting, from the sheet 44, a circular portion M1 including seven sponge pillars corresponding to FIG. 8.

Since the brush 40 has the plurality of sponge pillars 42 comprising columnar sponge members, dust and the like can be satisfactorily caught as in a brush having a columnar or doughnut-like hairs planted on the entire area of the base 41. In addition, since the appropriate pitches 43 are formed between the sponge pillars 42, a water film with removed dust and the like can be satisfactorily separated as compared to a brush having a columnar or doughnut-like hairs or sponge arranged on the entire area of the base 41. Separation of the water film is kept excellent even when a swing angle α of the brush arm 10a (revolution position of the brush 40) changes.

Figure 11:
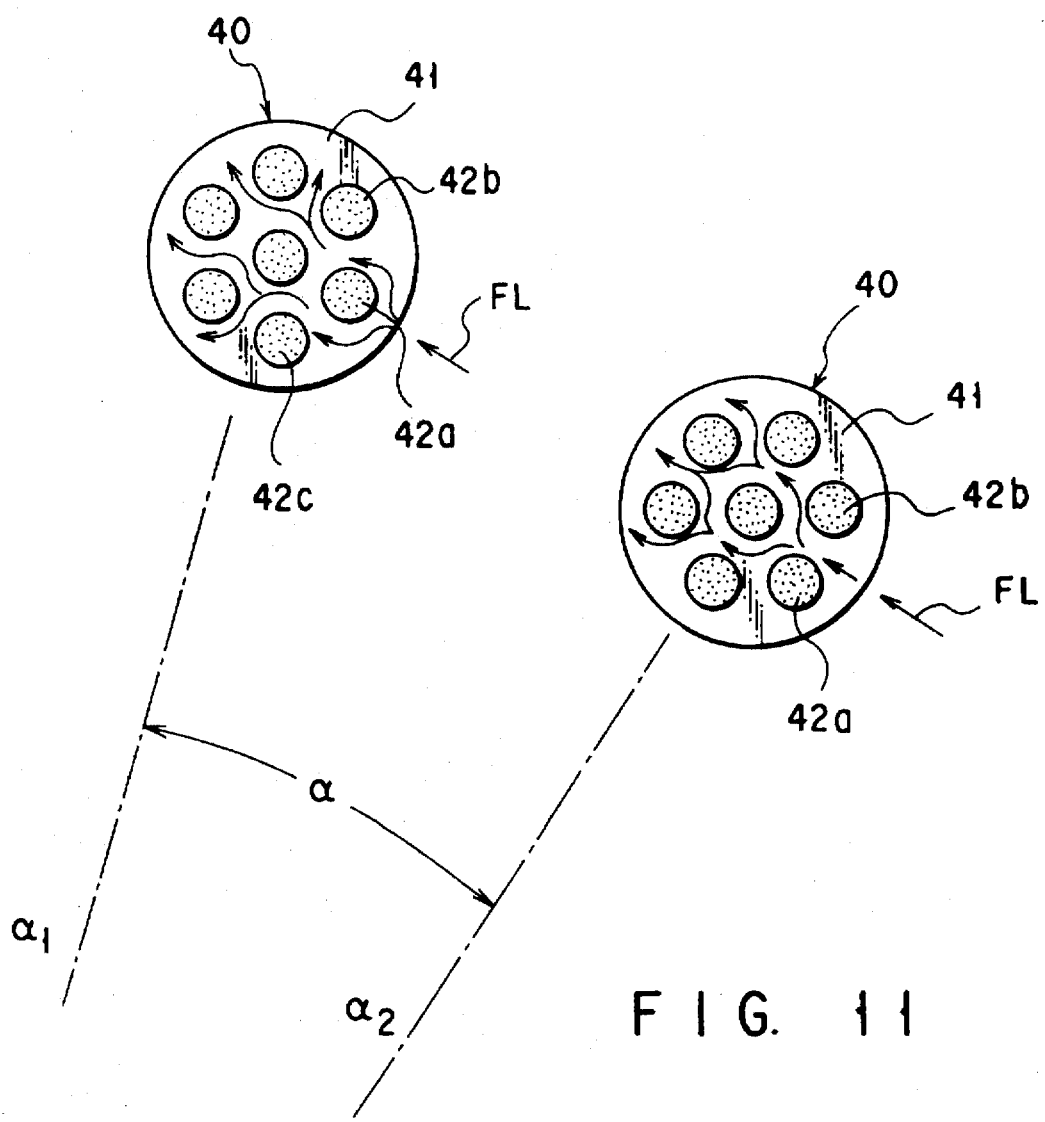
FIG. 11 is an explanatory view showing the function of the cleaning brush shown in FIG. 8 while changing the swing angle.

FIG. 11 shows the relationship between the swing angle α of the brush arm 10a and separation of the water film from the sponge pillars 42. First, in the brush 40 at the position corresponding to a swing angle α1, a sponge pillar 42a at the front of the sponge pillars 42 acts as a barrier for a flow FL of the water film. However, channels are ensured between the sponge pillar 42a and sponge pillars 42b and 42c on both the sides of the sponge pillar 42a. Therefore, the flow FL of the water film passes between the sponge pillars 42 and exits to the rear side. At this time, dust and the like float on the water film and are removed.

When the brush 40 is turned to a position corresponding to a swing angle α2, the sponge pillars 42a and 42b on the front side act as barriers. However, a channel is ensured between the sponge pillars 42a and 42b, so that the flow FL of the water film passes between the sponge pillars 42 and exits to the rear side. At this time, dust and the like float on the water film and are removed.

As described above, even when the swing angle α of the brush arm 10a changes, the flow of the water film is kept excellent.

Figure 12:
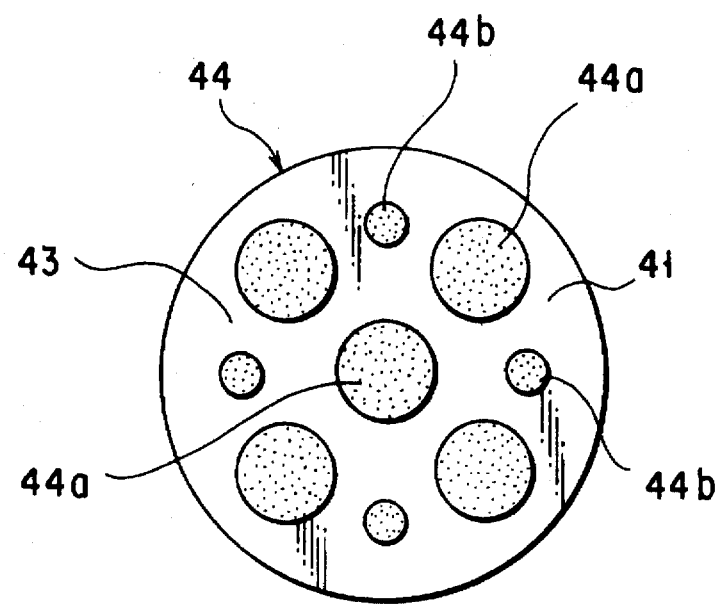
FIG. 12 is a plan view showing the main part of a modification of the front face cleaning brush.

FIG. 12 shows a front face cleaning brush 44 as a modification. The front face cleaning brush 44 has the chemical-resistant base 41 consisting of, e.g., a plastic, as in the above embodiment, a plurality of large-diameter columnar sponge pillars 44a and a plurality of small-diameter columnar sponge pillars 44b, which are point-symmetrically arranged on the base 41. A total of five large-diameter sponge pillars 44a are arranged, i.e., four are point-symmetrically arranged with respect to the central point while one is arranged at the center. A total of four small-diameter sponge pillars 44b are point-symmetrically arranged with respect to the central point. The appropriate pitches 43 are formed between the sponge pillars 44a and 44b. The number and arrangement of the sponge pillars 44a and 44b are not limited to those described above. The sponge pillars 44a and 44b consist of polyvinyl alcohol or polypropylene.

Normally, to increase the trap efficiency for dust and the like, it is said that the diameter of the sponge pillar on the base 41 is preferably reduced, and the number of sponge pillars is preferably increased. As the diameter of the sponge pillar 42 becomes smaller, "twist" tends to occur. When the sponge pillars are "twisted", dust and the like captured by the sponge pillars may be released by vibrations due to the "twist", though the sponge pillars can catch the dust and the like.

However, in the front face cleaning brush 44 shown in FIG. 12, the large-diameter sponge pillars 44a and the small-diameter sponge pillars 44b are arranged. With this arrangement, the load on the small-diameter sponge pillars 44b is reduced, so that "twist" can be prevented.

Figure 13:
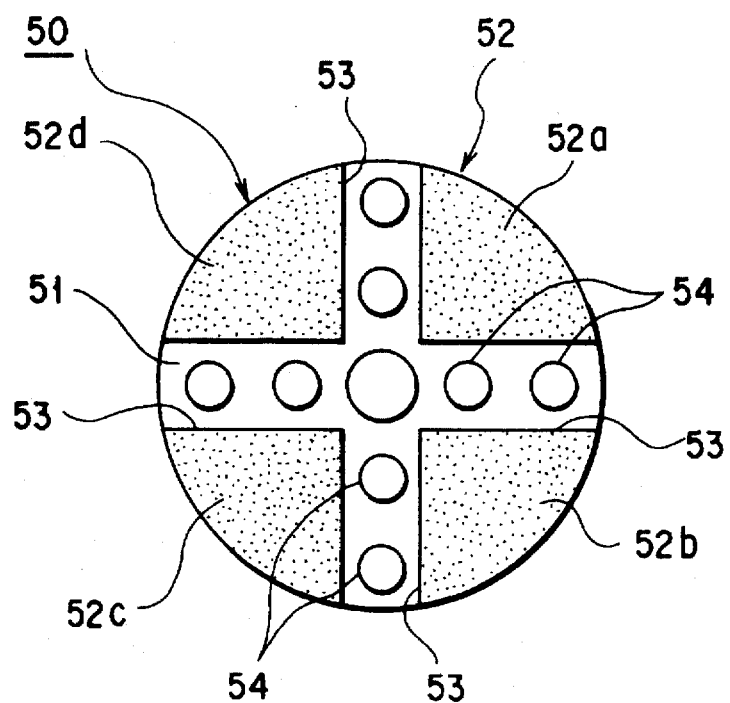
FIG. 13 is a plan view showing the main part of a rear face cleaning brush.

A rear face cleaning brush will be described below. FIG. 13 is a plan view showing the main part of a rear face cleaning brush 50. The rear face cleaning brush 50 has a chemical-resistant base 51 consisting of, e.g., a plastic, and a sponge body 52 arranged on the base 51 and consisting of polyvinyl alcohol or polypropylene. A cross notch 53 is formed in the sponge body 52 to divide the sponge body 52 into four sectors 52a to 52d. Two bundles of planted hairs 54 consisting of a material e.g., polypropylene harder than a sponge are arranged in each radial section of the notch 53, and each bundle of planted hairs 54 is so small that channels are formed on both the sides.

Figure 14:
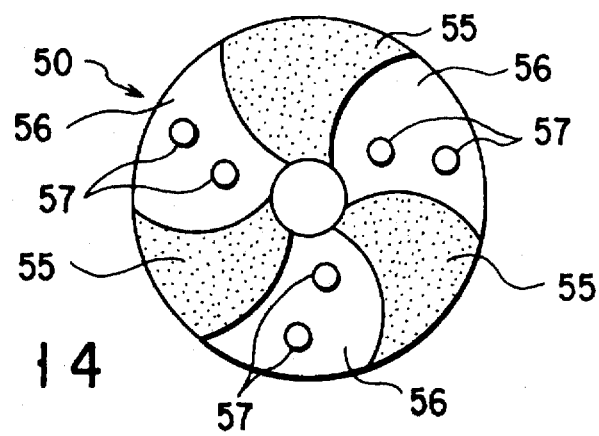
FIG. 14 is a plan view showing the main part of a modification of the rear face cleaning brush.

FIG. 14 is a plan view showing a modification of the rear face cleaning brush 50. This rear face cleaning brush 50 has sponge bodies 55 consisting of polyvinyl alcohol or polypropylene and arranged in a spiral shape to have a width increasing outward from the center in the radial direction. Grooves 56 are formed in a spiral shape to have a width increasing outward in the radial direction. Two bundles of planted hairs 57 consisting of, e.g., polypropylene are arranged in each groove 56, and each bundle of planted hairs 57 is so small that channels are formed on both the sides.

When the rear face cleaning brush 50 shown in FIG. 13 or 14 rotates about its axis, dust and the like can efficiently float by the bundles of planted hairs 54 or 57. In addition, the dust and the like can be properly caught by the sponge sectors 52a to 52d or the sponge bodies 55. Therefore, the dust removal rate can be increased.

As described above, in the front face cleaning, the cleaning brush 40 or 44 shown in FIG. 8 or 12 is used, and in the rear face cleaning, the cleaning brush 50 shown in FIG. 13 or 14 is used.

Figure 2:
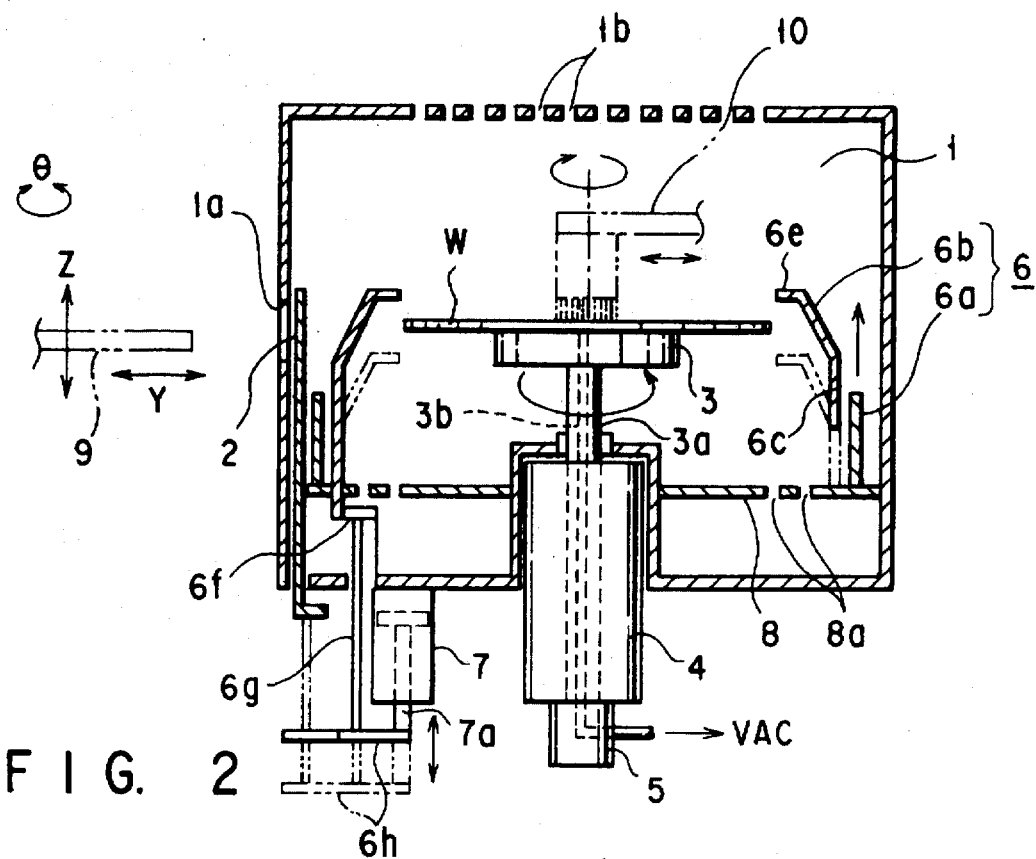
FIG. 2 is a sectional side view of the cleaning apparatus taken along a line II—II in FIG. 1.

More specifically, where a vacuum suction chuck is employed for the front face cleaning, and a mechanical chuck is employed for the rear face cleaning, the operation is performed as follows. In the front face cleaning, the wafer W with its front face facing upward is fixed by the vacuum suction chuck, as shown in FIGS. 2 and 3. While revolving the front face cleaning brush 40 or 44 shown in FIG. 8 or 12 (e.g., moving the brush 40 or 44 from the center to the periphery or along the diameter of the wafer W), the cleaning liquid is supplied to the wafer W from the brush 40 or 44 side, thereby removing particulate contaminants from the front face.

Figure 15:
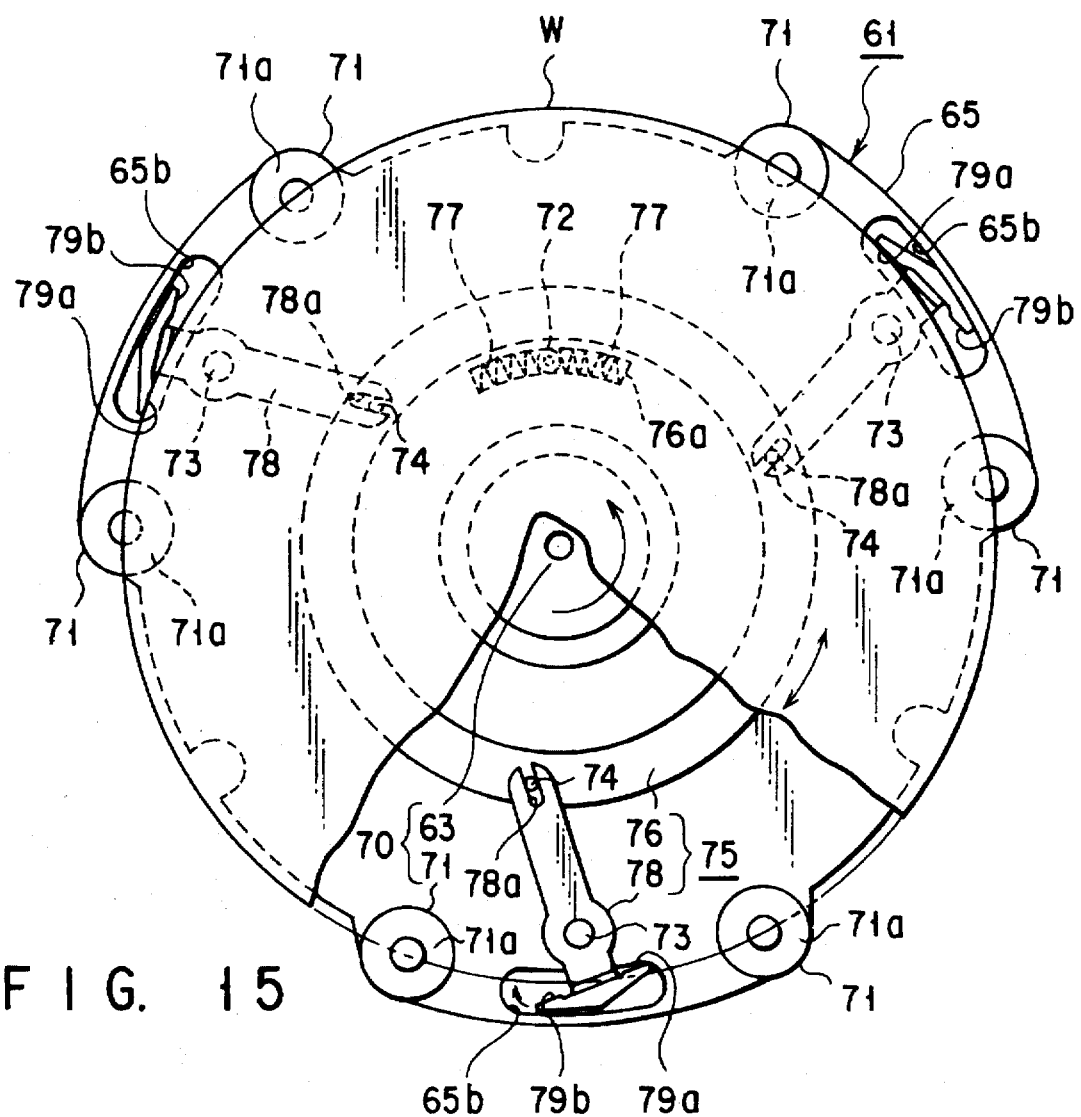
FIG. 15 is a plan view showing the main part of a mechanical spin chuck.
Figure 16:
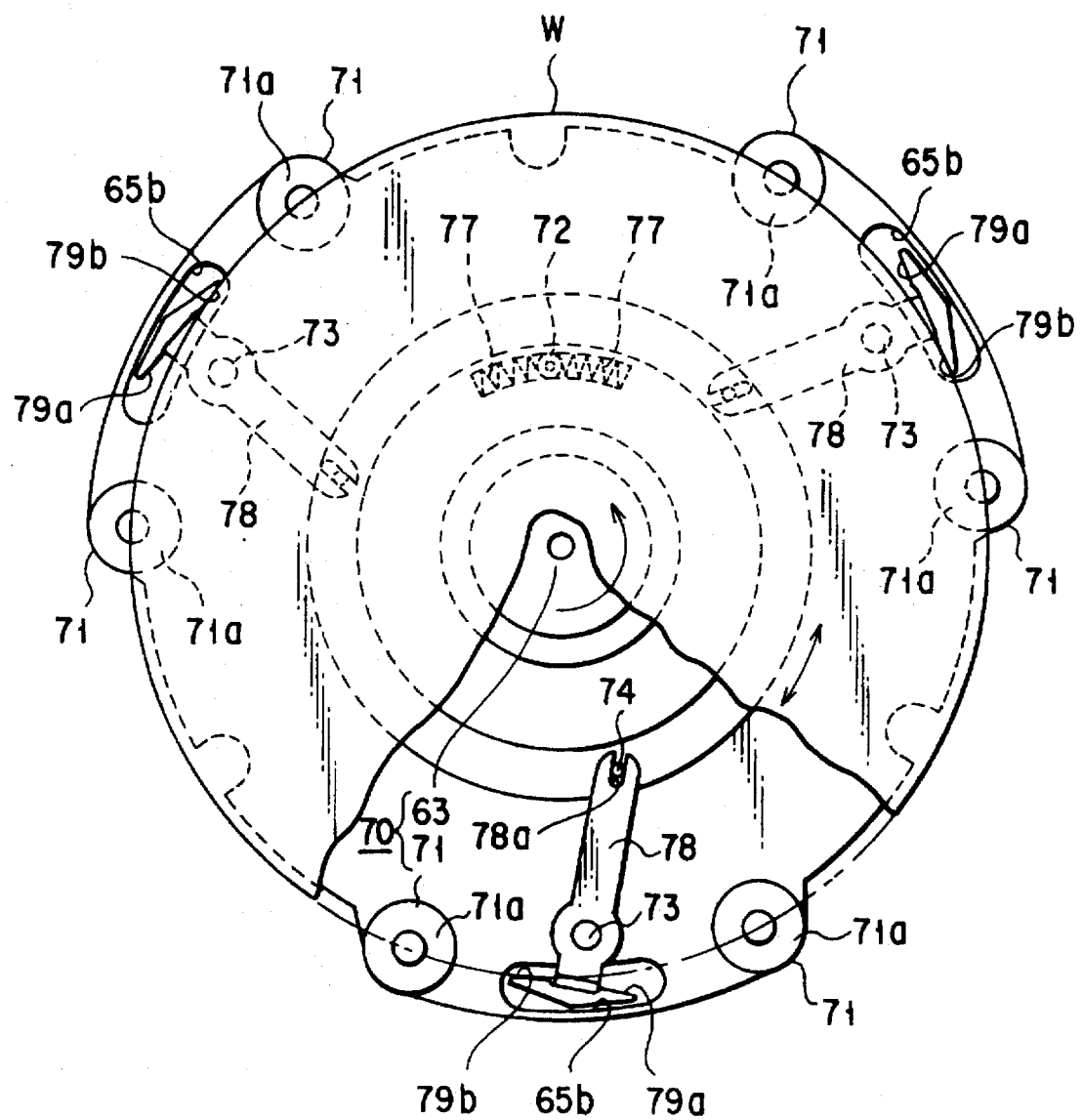
FIG. 16 is a plan view showing the operation of the spin chuck shown in FIG. 15.
Figure 17:
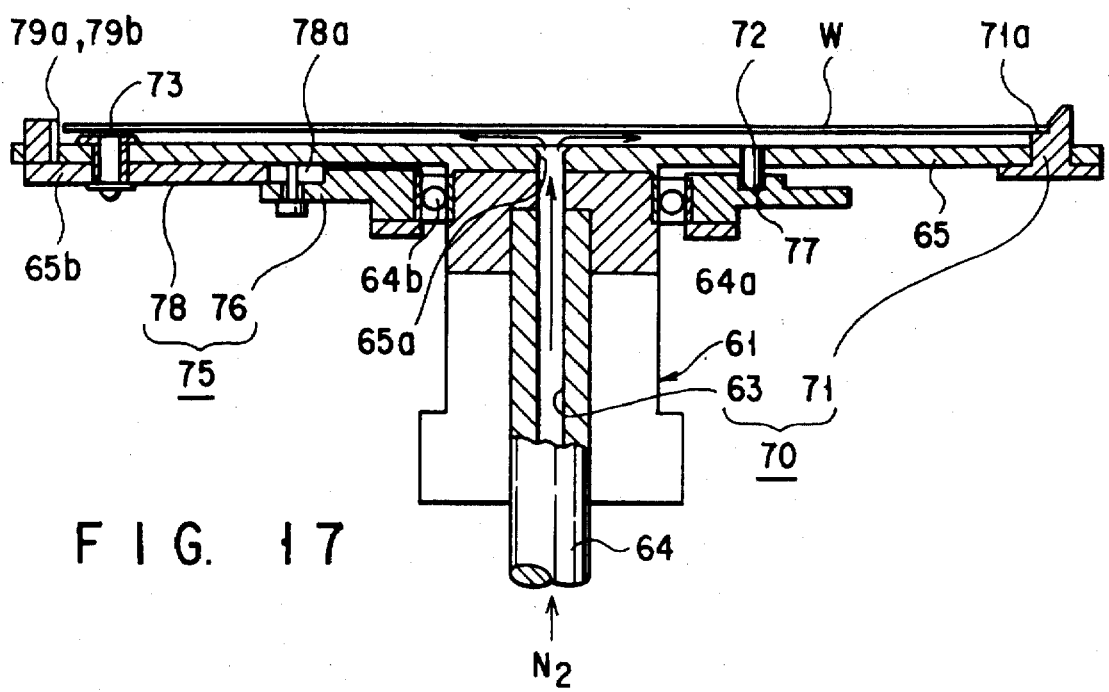
FIG. 17 is a partially sectional view showing the main part of the spin chuck shown in FIG. 15.
Figure 18:
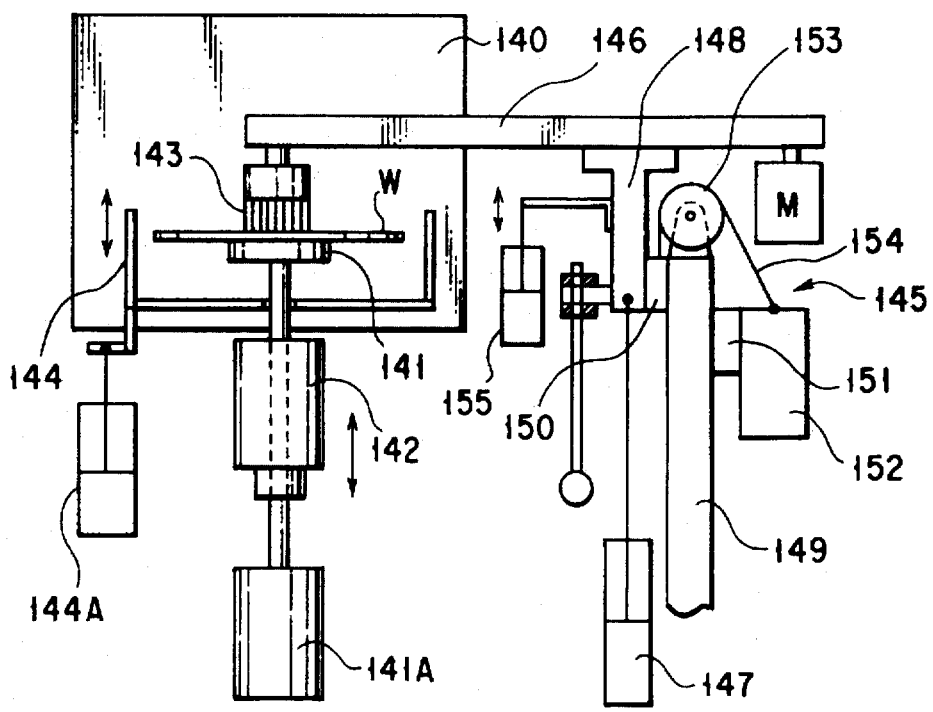
FIG. 18 is a view schematically showing a conventional cleaning apparatus.
Figure 19:
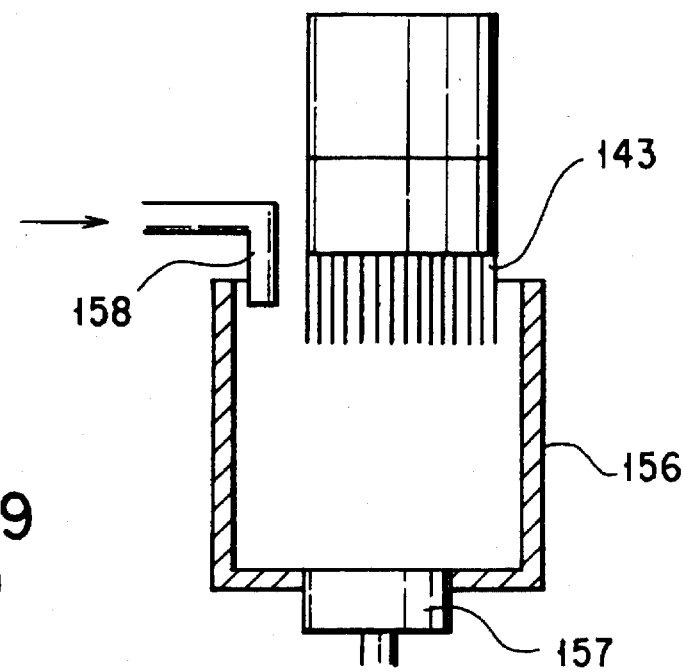
FIG. 19 is a view schematically showing the brush cleaning unit of the conventional cleaning apparatus.
Figure 20A:
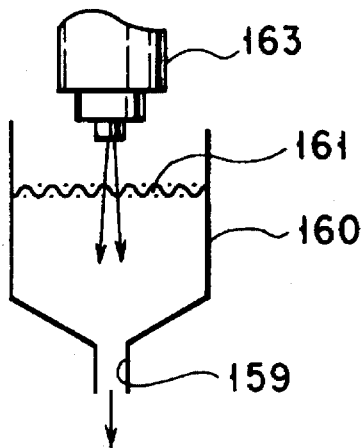
FIGS. 20A and 20B are views showing the dummy dispensing state of the jet water spray nozzle of the conventional cleaning apparatus.
Figure 20B:
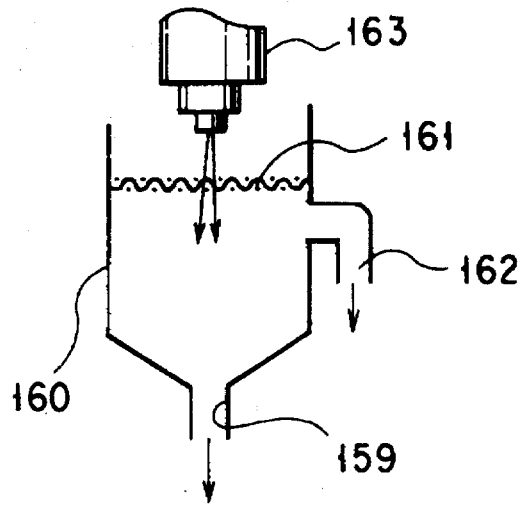

The wafer is reversed by a reversing unit (not shown) to start the rear face cleaning. In the rear face cleaning, the wafer W with its rear face facing upward is fixed by the mechanical chuck as shown in FIGS. 15 to 17. While rotating the rear face cleaning brush 50 shown in FIG. 13 or 14 about its axis, and at the same time, revolving it, the cleaning liquid is supplied to the wafer W from the brush 50 side, thereby removing particulate contaminants from the rear face.

Where a mechanical chuck is employed for both the front face cleaning and rear face cleaning, the operation is performed as follows. In the rear face cleaning which is performed first, the wafer W with its rear face facing upward is fixed by the mechanical chuck as shown in FIGS. 15 to 17. While rotating the rear face cleaning brush 50 shown in FIG. 13 or 14 about its axis, and at the same time, revolving it, the cleaning liquid is supplied to the wafer W from the brush 50 side, thereby removing particulate contaminants from the rear face.

The wafer is reversed by a reversing unit (not shown) to start the front face cleaning. In the front face cleaning, the wafer W with its front face facing upward is fixed by the mechanical chuck as shown in FIGS. 15 to 17. While revolving the front face cleaning brush 40 or 44 shown in FIG. 8 or 12 (e.g., moving the brush 40 or 44 from the center to the periphery or along the diameter of the wafer W), the cleaning liquid is supplied from the brush 40 or 44 side, thereby removing particulate contaminants from the front face.

A semiconductor wafer cleaning apparatus having a mechanical spin chuck will be described below with reference to FIGS. 15 to 17.

A spin chuck 61 has a rotation plate 65 horizontally coupled to the upper end portion of a hollow cylindrical rotating shaft 64 rotated by a driving motor (not shown). A suction holding mechanism 70 for holding the wafer W in a horizontal state is arranged on the rotation plate 65. An auxiliary holding mechanism 75 is arranged to hold the wafer W when the spin chuck 61 is to be accelerated to start or decelerated to stop. A supply passage 63 for supplying a gas ($N_2$ gas) for preventing entrance of a cleaning liquid is formed in the hollow portion of the rotating shaft 64.

The suction holding mechanism 70 holds the wafer W when the spin chuck 61 is to be rotated at a low speed or stopped. The holding mechanism 70 holds the wafer W in the horizontal state by using a negative pressure generated on the rear face side of the wafer W mounted on holding grips 71 which stand around the rotation plate 65 at appropriate intervals. More specifically, the wafer W is sucked and held by a negative pressure generated when the $N_2$ gas is supplied from the supply passage 63 through a passage 65a formed in the rotation plate 65.

The auxiliary holding mechanism 75 has a rotary body 76 which is rotatably arranged, through a bearing 64b, on the circumference of a rotation portion 64a fixed to the rotating shaft 64. Springs 77 are arranged to apply a resilient force to set the rotary body 76 at the neutral position of forward/reverse rotation. Holding bodies 78 are pivotally mounted on the rotation plate 65. One end of each holding body 78 rotatably slidably engages with the rotary body 76, and the other end has two press portions 79a and 79b for pressing the wafer W.

An arcuated groove 76a coaxial with the center of rotation is formed in the upper surface of the rotary body 76 arranged under the rotation plate 65. A base point pin 72 extending through the rotation plate 65 is inserted to the arcuated groove 76a, and the compression springs 77 are arranged on both the sides of the base point pin 72. Therefore, the neutral position of forward/reverse rotation of the rotary body 76 is maintained by the resilient force of the springs 77.

The holding body 78 consists of a plate member swingable in the horizontal direction and pivotally mounted on a support pin 73 suspended from the rotation plate 65. A slit 78a is formed in one end of the holding body 78, i.e., in the end portion on the rotation center side. A pin 74 projecting from the rotary body 76 rotatably slidably engages with the slit 78a. The two press portions 79a and 79b engaging with the side end face of the wafer W are arranged at the other end of the holding body 78 on the peripheral side. The press portions 79a and 79b extend through an arcuated guide hole 65b formed at the outer circumferential portion of the rotation plate 65 and project upward. The holding bodies 78 are attached at three portions of the rotation plate 65 at an angular interval of 120 degrees.

When the wafer W is to be cleaned, the wafer W transferred by the wafer transfer arm is temporarily mounted on flange portions 71a of the holding grips 71 first. The wafer transfer arm is moved downward and retreated from the spin chuck 61. The $N_2$ gas is supplied from an $N_2$ gas source into the $N_2$ supply passage 63 of the rotating shaft 64. The $N_2$ gas is supplied from the $N_2$ gas supply passage 63 to an below the rear face of the wafer W through the passage 65a and flows toward the circumferential direction. A negative pressure is generated on the rear face side of the wafer W by the Bernoulli effect. With this negative pressure, the wafer W is sucked and held by the spin chuck 61.

In this state, the rotating shaft 64 is rotated. The holding bodies 78 which are positioned in the radial direction of the rotating plate 65 in a stop state are displaced as shown in FIG. 15. More specifically, the end portions of the holding bodies 78 on the rotating shaft side move in a direction opposite to the direction of rotation (counterclockwise), and at the same time, the holding bodies 78 rotate counterclockwise. Simultaneously, one press portion 79a engages with the edge portion of the wafer W to hold the wafer W. When the rotation speed of the rotating shaft 64 reaches a predetermined value, this inertial function decreases. The holding bodies 78 are returned by the biasing force of the springs 77. Although the wafer W is released from the press portions 79a, the wafer W is sucked and held by the above-mentioned suction holding mechanism 70.

As described above, the wafer W is rotated by the driving motor through the rotating shaft 64 and the rotation plate 65 while held in the horizontal state. The surface of the wafer W is rubbed and cleaned by the front face cleaning brush 40 or 44 or the rear face cleaning brush 50, thereby removing particulate contaminants adhering to the surface. This cleaning process can be performed using only brush cleaning in which cleaning is performed while the cleaning liquid is supplied near the cleaning brush.

The cleaning process may be performed using only jet cleaning in which the cleaning liquid is sprayed from the jet nozzle 19, without performing brush cleaning. Alternatively, the cleaning process can be performed using various methods depending on the type of an object to be treated or the cleaning state, so that brush cleaning and jet cleaning can be alternately or simultaneously performed. Since the $N_2$ gas is supplied to the rear face side of the wafer W and flows toward the circumferential direction, the cleaning liquid can be prevented from flowing to the rear face side of the wafer W.

When the rotating shaft 64 decelerates to stop, the holding bodies 78 are displaced, as shown in FIG. 16. More specifically, the end portion of the holding body 78 on the rotating shaft side is moved in the direction of rotation by the inertial force, and at the same time, the holding body 78 rotates clockwise. Simultaneously, the press portions 79b of the holding bodies 78 engage with the edge portions of the wafer W to hold the wafer W.

The operation of the spin chuck 61 can be summarized as follows. When the spin chuck 61 stops, the holding bodies 78 are maintained at the neutral position by the biasing force of the springs. When the spin chuck 61 is to be started/accelerated, the end portion of each holding body 78 on the rotating shaft side moves in the direction opposite to the direction of rotation, and the wafer W is held by the press portions 79a. When the spin chuck 61 is rotating at a constant rate, the rotating body 76 is returned to the neutral position by the biasing force of the springs. The wafer W is released from the press portions 79a of the holding bodies 78, sucked and held by the negative pressure generated by the $N_2$ gas. When the spin chuck 61 is to be decelerated/stopped, the end portion of each holding body 78 on the rotating shaft side moves in the direction of rotation, and the wafer W is held by the press portions 79b.

The wafer W can be properly held both in the starting/accelerating state and the decelerating/stop state of the spin chuck 61. For this reason, the wafer W can always be stably held, resulting in an increase in efficiency of the processing operation. In an abrupt accelerating/decelerating state as well, the wafer W can be properly held because the inertial force becomes larger.

In the above example, the holding bodies 78 are arranged at three portions. However, the number of holding bodies 78 need not always be three, and at least three holding bodies suffice.

In the above embodiment, an object to be treated is a semiconductor wafer. However, an object to be treated in the present invention is not limited to a semiconductor wafer. The present invention can also be applied to the cleaning process of, e.g., an LCD substrate, a photomask, a ceramic substrate, a compact disc, or a printed board.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A cleaning apparatus for brushing an object to be treated while rotating said object, comprising:
    a spin chuck for holding and rotating said object;
    a brush for contacting said object held by said spin chuck to rub a surface of said object;
    an arm for supporting said brush;
    a processing chamber housing said spin chuck, said brush, and said arm;
    a support coupled to said arm and moving together with said arm in a horizontal direction, said support and said arm being capable of relatively displacing in a vertical direction;
    a resilient member arranged between said arm and said support and deformed in accordance with a relative displacement of said arm and said support in the vertical direction, said resilient member being deformed and generating a biasing force of said brush against said object when said brush contacts said object held by said spin chuck;
    a horizontal driver for moving said support in the horizontal direction; and
    a vertical driver for moving said support in the vertical direction,
    wherein said biasing force of said brush is set by adjusting a downward moving amount of said support in the vertical direction.

2. An apparatus according to claim 1, further comprising a linear guide for coupling said arm to said support.

3. An apparatus according to claim 1, further comprising a stopper for regulating a maximum downward moving amount of said support.

4. An apparatus according to claim 1, wherein said resilient member comprises a compression spring applied with a load of said brush and said arm.

5. An apparatus according to claim 4, further comprising a motor attached to said arm to be located above said resilient member and to rotate said brush, and a transmission arranged along said arm to transfer a driving force of said motor to said brush.

6. An apparatus according to claim 1, wherein said support is moved by said horizontal driver such that said brush can move between a waiting position offset from above said object held by said spin chuck and a first position above said object held by said spin chuck.

7. An apparatus according to claim 6, wherein said horizontal driver swings said arm between the waiting position and the first position.

8. An apparatus according to claim 1, further comprising supply means, supported by said arm, for supplying a cleaning liquid to said brush.

9. An apparatus according to claim 8, wherein said supply means comprises a cleaning liquid receptacle portion arranged at a rear side of said brush, a tube for supplying the cleaning liquid to said cleaning liquid receptacle portion, and a cleaning liquid passage formed between said cleaning liquid receptacle portion and said brush.

10. An apparatus according to claim 8, further comprising a first cup part vertically movable to enclose said spin chuck in said processing chamber, a cup driver for moving said first cup part in the vertical direction between an upper position where an upper end of said first cup part comes above said object held by said spin chuck and a lower position where said upper end of said first cup part comes below said object held by said spin chuck, and a second cup part fixed to said processing chamber to cover a gap formed below said first cup part when said first cup part is set at the upper position.

11. A cleaning apparatus for brushing a front face of a semiconductor wafer on which a semiconductor device is to be formed, while rotating said semiconductor wafer, comprising:

a spin chuck for holding and rotating said wafer;

a brush for contacting said wafer held by said spin chuck to rub a surface of said wafer, said brush comprising a plurality of sponge pillars arranged at intervals and contacting said wafer substantially only with said sponge pillars;

an arm for supporting said brush;

a processing chamber housing said spin chuck, said brush, and said arm;

a support coupled to said arm and moving together with said arm in a horizontal direction, said support and said arm being capable of relatively displacing in a vertical direction;

a resilient member arranged between said arm and said support and deformed in accordance with a relative displacement of said arm and said support in the vertical direction, said resilient member being deformed and generating a biasing force of said brush against said wafer when said brush contacts said wafer held by said spin chuck;

a horizontal driver for moving said support in the horizontal direction; and a vertical driver for moving said support in the vertical direction, wherein said biasing force of said brush is set by adjusting a downward moving amount of said support in the vertical direction.

12. An apparatus according to claim 11, wherein said sponge pillars comprise a plurality of first sponge pillars each having a large diameter and a plurality of second sponge pillars each having a small diameter, said first and second sponge pillars being alternately arranged.

13. An apparatus according to claim 11, further comprising supply means, supported by said arm, for supplying a cleaning liquid to said brush.

14. An apparatus according to claim 13, wherein said supply means comprises a cleaning liquid receptacle portion arranged at a rear side of said brush, a tube for supplying the cleaning liquid to said cleaning liquid receptacle portion, and a cleaning liquid passage formed between said cleaning liquid receptacle portion and said brush.

15. An apparatus according to claim 13, further comprising a first cup part vertically movable to enclose said spin chuck in said processing chamber, a cup driver for moving said first cup part in the vertical direction between an upper position where an upper end of said first cup part comes above said wafer held by said spin chuck and a lower position where said upper end of said first cup part comes below said wafer held by said spin chuck, and a second cup part fixed to said processing chamber to cover a gap formed below said first cup part when said first cup part is set at the upper position.

16. A cleaning apparatus for brushing a rear face of a semiconductor wafer on which no semiconductor device is to be formed, while rotating said semiconductor wafer, comprising:

a spin chuck for holding and rotating said wafer;

a brush for contacting said wafer held by said spin chuck to rub a surface of said wafer, said brush comprising a plurality of sponge pillars arranged at an interval and a plurality of bundles of hairs arranged at an interval and contacting said wafer substantially with only said sponge pillars and said bundles of hairs;

an arm for supporting said brush;

a processing chamber housing said spin chuck, said brush, and said arm;

a support coupled to said arm and moving together with said arm in a horizontal direction, said support and said arm being capable of relatively displacing in a vertical direction;

a resilient member arranged between said arm and said support and deformed in accordance with a relative displacement of said arm and said support in the vertical direction, said resilient member being deformed and generating a biasing force of said brush against said wafer when said brush contacts said wafer held by said spin chuck;

a horizontal driver for moving said support in the horizontal direction; and a vertical driver for moving said support in the vertical direction, wherein said biasing force of said brush is set by adjusting a downward moving amount of said support in the vertical direction.

17. An apparatus according to claim 16, wherein said sponge pillars are arranged to form a plurality of grooves extending in a radial direction, and said bundles of hairs are arranged in the grooves.

18. An apparatus according to claim 16, further comprising supply means, supported by said arm, for supplying a cleaning liquid to said brush.

19. An apparatus according to claim 18, wherein said supply means comprises a cleaning liquid receptacle portion arranged at a rear side of said brush, a tube for supplying the cleaning liquid to said cleaning liquid receptacle portion, and a cleaning liquid passage formed between said cleaning liquid receptacle portion and said brush.

20. An apparatus according to claim 19, further comprising a first cup part vertically movable to enclose said spin chuck in said processing chamber, a cup driver for moving said first cup part in the vertical direction between an upper position where an upper end of said first cup part comes above said wafer held by said spin chuck and a lower position where said upper end of said first cup part comes below said wafer held by said spin chuck, and a second cup part fixed to said processing chamber to cover a gap formed below said first cup part when said first cup part is set at the upper position.

* * * * *